(12) United States Patent
Hung (10) Patent No.: US 7,329,930 B2
(45) Date of Patent: Feb. 12, 2008

(54) MICROMECHANICAL ACTUATOR WITH MULTIPLE-PLANE COMB ELECTRODES AND METHODS OF MAKING

(75) Inventor: Chang-Li Hung, Taipei (TW)

(73) Assignee: Opus Microsystems Corporation, Taipei (TW)

( * ) Notice: Subject to any disclaimer, the term of this patent is extended or adjusted under 35 U.S.C. 154(b) by 0 days.

(21) Appl. No.: 10/793,877

(22) Filed: Mar. 8, 2004

(65) Prior Publication Data

US 2005/0194650 A1 Sep. 8, 2005

(51) Int. Cl.
*H01L 27/14* (2006.01)

(52) U.S. Cl. .................................................. 257/414
(58) Field of Classification Search ................ None
See application file for complete search history.

(56) References Cited

U.S. PATENT DOCUMENTS 6,914,710 B1* 7/2005 Novotny et al. ............ 359/291

* cited by examiner

*Primary Examiner*—Kiesha Rose
(74) *Attorney, Agent, or Firm*—Troxell Law Office PLLC (57) ABSTRACT

A micro-electro-mechanical component comprising a movable element with comb electrodes, and two stationary elements with comb electrodes aligned and stacked on each other but electrically insulated by a layer of insulation material. The movable element is supported by multiple torsional hinges and suspended over a cavity such that the element can oscillate about an axis defined by the hinges. The comb electrodes of the movable element are interdigitated with the comb electrodes of one stationary element in the same plane to form an in-plane comb actuator. The comb electrodes of the movable element are also interdigitated in an elevated plane with the comb electrodes of another stationary element to form a vertical comb actuator. As a result, the micro-electro-mechanical component is both an in-plane actuator and a vertical comb actuator, or a multiple-plane actuator. Methods of fabricating such actuator are also described.

13 Claims, 11 Drawing Sheets

MICROMECHANICAL ACTUATOR WITH MULTIPLE-PLANE COMB ELECTRODES AND METHODS OF MAKING

BACKGROUND OF THE INVENTION

The present invention relates to a micro-electro-mechanical component, and more particularly to actuator.

Micro-electro-mechanical mirrors have great potential in wide variety of optical applications including optical communication, confocal microscope, laser radar, bar code scanning, laser printing and projection display. For some optical scanning applications such as laser printing and scanning projection display, the mirror needs to achieve large optical scanning angle at specific frequency. Large optical angle is also a key to optical resolution and smaller product footprint. For scanning mirror, this requirement poses a challenge in the design of actuator to generate large actuation force. A variety of micro-electro-mechanical actuator designs have been proposed to steer or scan light beam for various applications. In order to achieve deflection or movement of the micro-component out of the chip plane, it is known to design a movable element containing electrodes and a stationary element containing counter-electrodes such that the movable element can be driven by the electrical force.

In U.S. Pat. No. 6,595,055, Harald Schenk, et al described a micromechanical component with both the oscillating body and the frame or stationary layer located on the same chip plane. Capacitance is formed between the lateral surfaces of the oscillating body and the frame layer and will vary as the movable body oscillates about a pivot axis out of the chip plane. The structure is suspended and supported by an insulating layer and a substrate to allow out-of-plane motion of the oscillating body. They described in "Large Deflection Micromechanical Scanning Mirrors for Linear Scan and Pattern Generation" in Journal of Selected Topics in Quantum Electronics, Vol 6, No 5, 2000 that the scanning mirror can scan at large angle with low driving voltage at low frequency. However, movable comb electrodes located on the mirror perimeter will increase dynamic deformation of the mirror or movable body. Excessive dynamic deformation of scanning mirror will increase divergence of reflected light beam and significantly deteriorate optical resolution of the device for high speed scanning applications such as printing and scanned display. Additional electrode insulated from the structure may be required to perturb the symmetry of the setup in order to quickly initiate oscillation of the mirror. Furthermore, the setup only allows analog operation (scanning) but not digital operation (static angle positioning) of the movable body.

R. Conant describes in "Staggered Torsional Electrostatic Combdrive and Method of Forming SAME" (Patent Application US2003/0019832), a comb-drive actuator with a stationary comb teeth assembly and a moving comb teeth assembly with a mirror and a torsional hinge, and the method of fabricating such devices. The moving assembly is positioned entirely above the stationary assembly by a predetermined vertical displacement during resting state. The actuator is able to scan at relative high frequency with mirror dynamic deformation lower than the Rayleigh limit. However, the optical scan angle which dominates the optical resolution is notably smaller than what Schenk has reported despite a relative high voltage is applied. An alternate design was proposed with additional stationary comb teeth assemblies stacked on top of the stationary comb teeth assembly. This stacked comb teeth assemblies were claimed to be used for the purpose of capacitive sensing and frequency tuning of the movable assembly despite that the method of frequency tuning was not described. In the fabrication process steps, a process step is required to open alignment windows by etching through the top wafer to reach the insulating oxide layer then removing the oxide layer in order to use features located on the bottom wafer for alignment of subsequent steps. If the top wafer is thick for the purpose of minimizing dynamic deformation, this process could be time-consuming and hence, expensive.

S. Olav describes in "Self-Aligned Vertical Combdrive Actuator and Method of Fabrication" (US Patent Application US2003/0073261), a vertical comb-drive actuator with small gaps between comb teeth for increased torsional deflection, a double-sided vertical comb-drive actuator for dual-mode actuation, vertical piston and scan, and the method of making them. Despite the proposed fabrication process steps allow self-alignment of the embedded comb teeth, the process of vertical comb-drive actuator requires highly skilled techniques to etch the bottom comb teeth and twice deep silicon trench etching of the bottom substrate. For dual-mode vertical comb-drive actuator, the fabrication process steps start with deep silicon trench etching of the device layer of a Silicon-On-Insulator (SOI) wafer then fusion bonding to another silicon wafer that resulting in a complex five-layer structure, two insulation oxide layers and three silicon layers. To form the bottom comb teeth highly skilled self-alignment etching techniques and twice deep silicon trench etching are still required.

SUMMARY OF THE INVENTION

It is the objective of the present invention to provide a micro-electro-mechanical actuator with in-plane comb electrodes and a supporting substrate with a cavity of specific depth.

It is the objective of the present invention to provide a micro-electro-mechanical actuator with both in-plane and vertical comb electrodes that increase the actuation force on the movable element, and the methods of fabricating such device.

It is a further objective of this invention to provide a micro-electro-mechanical actuator with both in-plane and dual-side vertical comb electrodes that increase the actuation force on the movable element, and the methods of fabricating such devices.

It is another objective of this invention to provide a method to support and fan out the bottom electrodes of the vertical comb electrodes.

It is another objective of this invention to provide a torsional hinge design with built-in electrodes that can be used to increase the effective torsional stiffness of the hinges such that the resonance frequency of the movable element in an actuator can be adjusted.

It is another objective of this invention to provide a method to decrease the effective torsional stiffness of the torsional hinges such that the resonance frequency of the movable element in an actuator can be adjusted.

DETAILED DESCRIPTION OF THE PREFERRED EMBODIMENTS

Figure 1A:
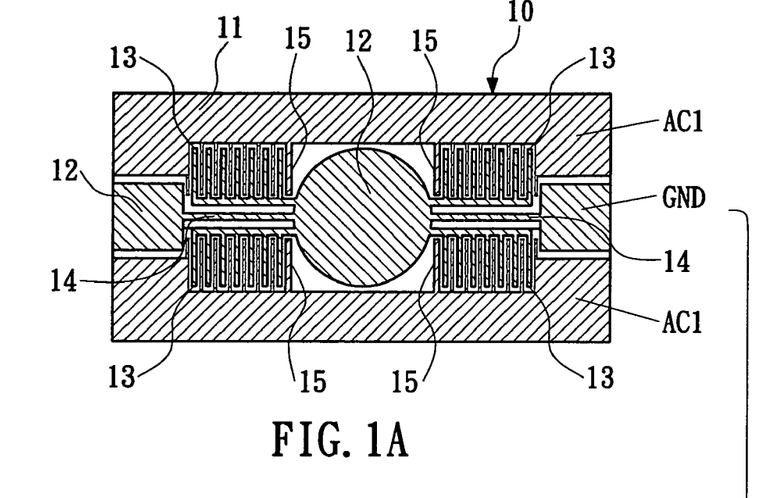
FIGS. 1A, 1B, and 1C show the top views of the top, middle and bottom layers of one embodiment of the present invention.
Figure 1B:
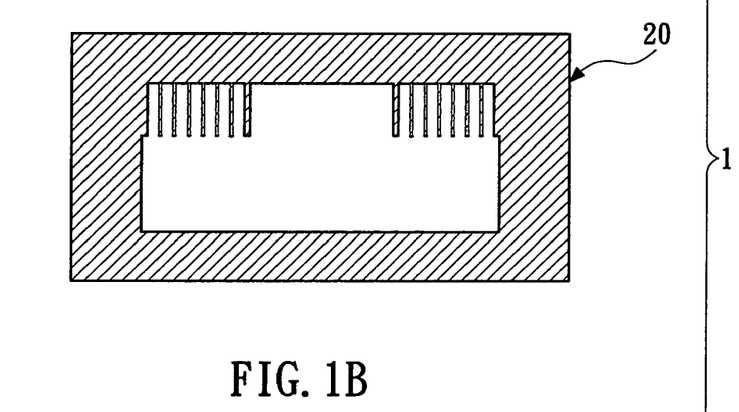
Figure 1C:
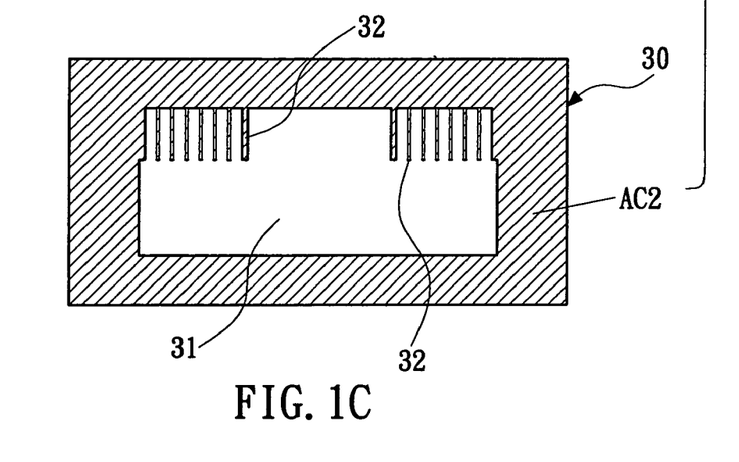

FIGS. 1A, 1B and 1C show the exploded top views of the three layers of a MEMS actuator in accordance with one embodiment of the present invention. Top layer 10, FIG. 1A, is consisted of a stationary and a movable elements 11, 12 both made of electrically conductive material, typically doped single crystal silicon. Movable element 12 including comb electrodes 13 is supported by multiple torsional hinges 14 and is electrically isolated from stationary structure 11. The stationary element 11 has comb electrodes 15 that are interdigitated in the same horizontal plane with the comb electrodes 13 of the movable element 12 such that the top layer 10 is an in-plane comb-drive actuator. Middle layer 20, FIG. 1B, is made of electrically non-conductive material, typically silicon dioxide. Bottom layer 30, FIG. 1C, consisting of a cavity 31 and stationary comb electrodes 32 located on one side of the torsional hinge 14, is made of electrically conductive material, typically doped single crystal silicon. Stationary comb electrodes 32 on bottom layer 30 are interdigitated with comb electrodes 13 of the movable element 12 on top layer 10 such that the movable element 12 and the bottom layer 30 form a vertical comb-drive actuator. Middle and bottom layers 20, 30 support the top layer 10 while middle layer 20 electrically isolates top and bottom layers 10, 30. As a result, the MEMS actuator 1 is consisted of both in-plane and vertical comb-drive actuators.

Figure 3:
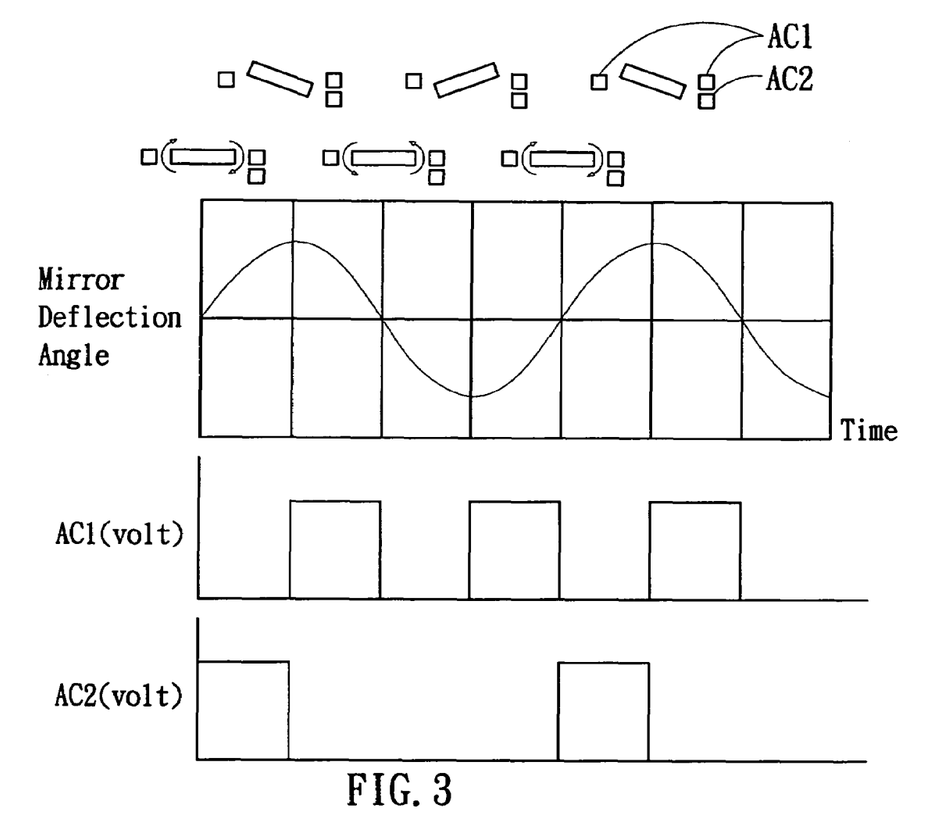
FIG. 3 illustrates one example of the relationship between the phase of mirror deflection angle and the phase of applied voltage sources for MEMS actuator depicted in FIG. 2.

The movable element 12 is typically connected to electrical ground while the stationary element 11 on the top layer 10 is connected to a voltage source AC1 and the bottom layer 30 is connected to another voltage source AC2. FIG. 3 illustrates the phase and amplitude relationships between deflection angle of movable element 12 and applied voltage sources AC1, AC2. The waveform of the voltage source can be square, triangular, sinusoidal, half-sinusoidal or other shapes to meet specific angular velocity needs.

Figure 1D:
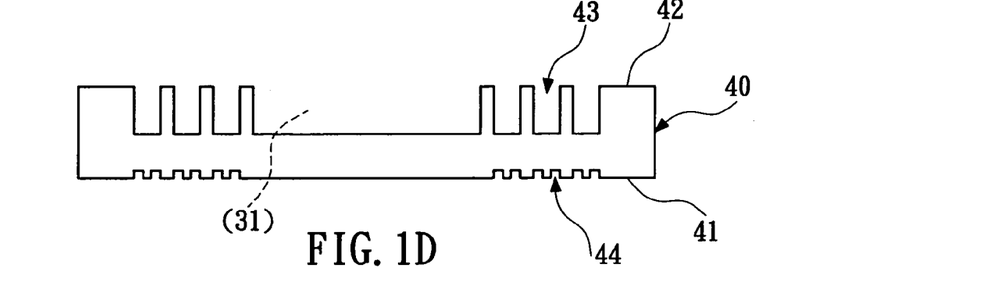
FIGS. 1D, 1E and 1F illustrate the fabrication process flow steps of the embodiment described in FIGS. 1A, 1B and 1C.
Figure 1E:
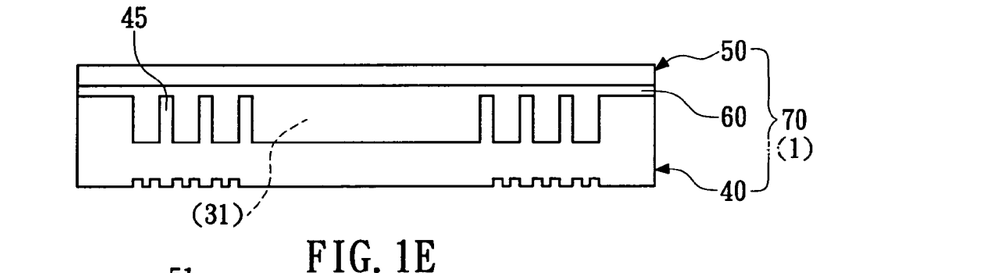
Figure 1F:
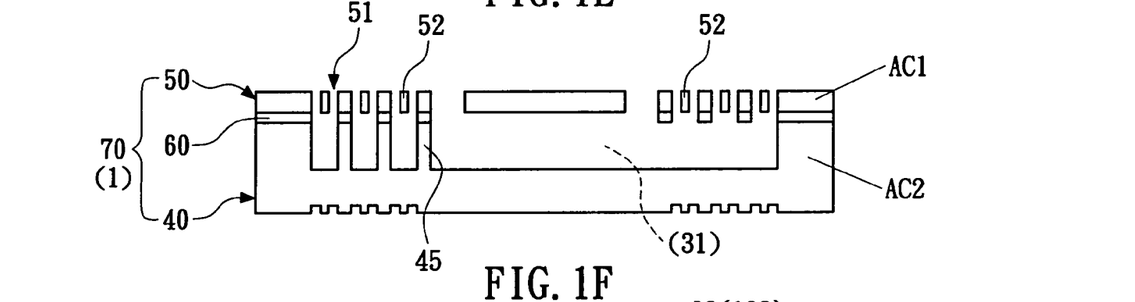

FIGS. 1D-1F illustrate one method of fabricating the comb-drive actuator in accordance with one embodiment of the present invention as described in FIGS. 1A-1C. The first step, FIG. 1D, starts by etching the backside 41(44) of a semiconductor wafer 40, preferably single crystal silicon then etches the front-side 42(43) using deep reactive ion etching (DRIE) with the etched features 44 on backside 41 for alignment 43, 44. The next step is to fusion bond the double-side 42, 41 etched wafer 40 to another wafer 50 coated with silicon dioxide 60 then annealed to increase bonding strength. The bonded wafer 70 becomes a three layer 50, 60, 40 structure and the top layer 50 may be ground and polished to desired thickness and to the required surface quality, FIG. 1E. The top layer 50 is then DRIE etched down to the middle layer 60 using the backside features (44) for alignment and the movable element 52 of the three-layer structure is released by removing the silicon dioxide (60) connecting to the stationary elements 45, FIG. 1F.

Figure 1G:
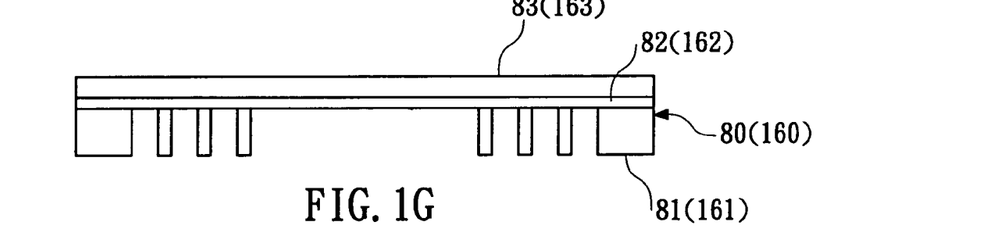
FIGS. 1G and 1H illustrate another fabrication process flow steps of the embodiment described in FIGS. 1A, 1B and 1C.
Figure 1H:
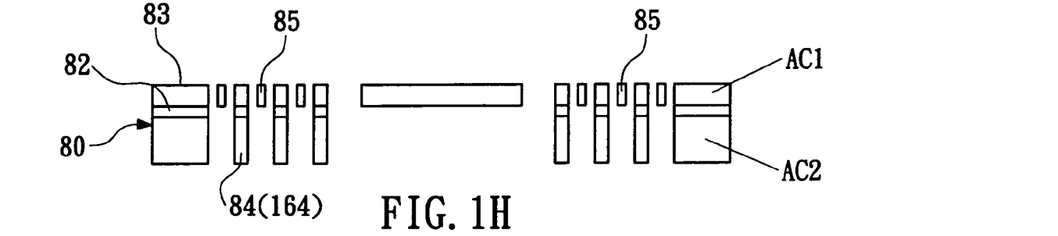

FIGS. 1G and 1H illustrate another fabrication method of the comb-drive actuator. The process starts with back-side 81 DRIE etching to the middle oxide layer 82 of a silicon-on-insulator (SOI) wafer 80, FIG. 1G. The wafer 80 is then etched from the front-side 83 of the wafer 80 to the middle oxide layer 82, FIG. 1H. The movable element 85 of the three-layer structure is then released by removing the silicon dioxide connecting to the stationary elements 84.

Figure 2A:
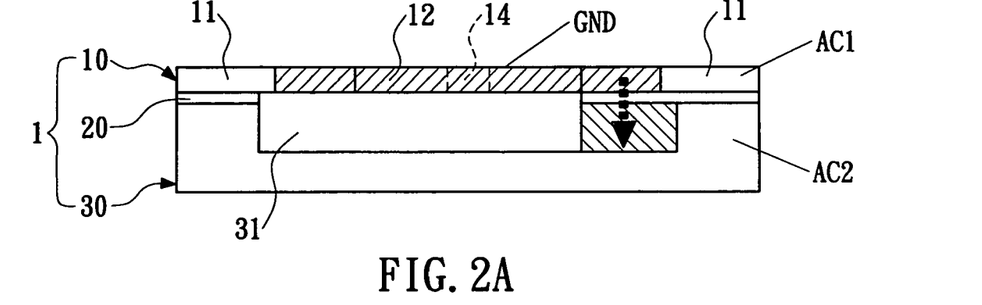
FIGS. 2A~2D illustrate another side view of the embodiment described in FIG. 1 and show the relationship of actuation force of in-plane and vertical comb electrodes when the mobile element of top layer is in oscillation motion. The vertical comb electrodes on the bottom layer are located only on one side of the torsional hinges.
Figure 2B:
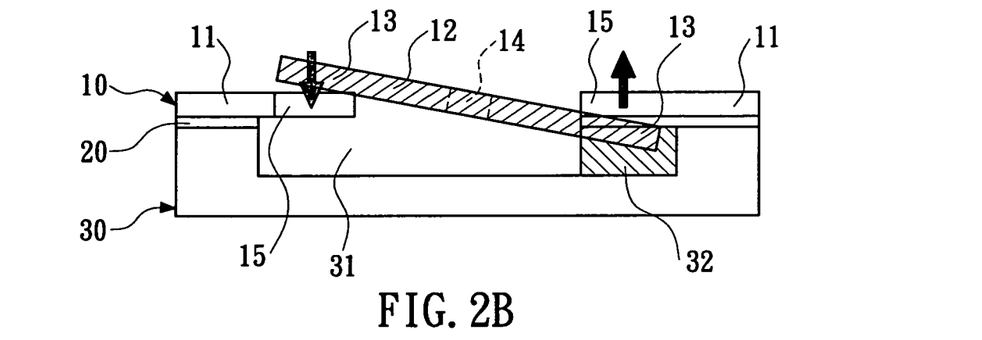
Figure 2C:
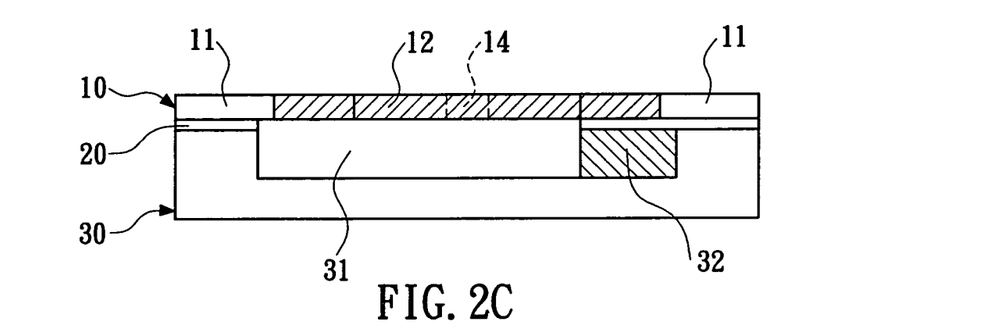
Figure 2D:
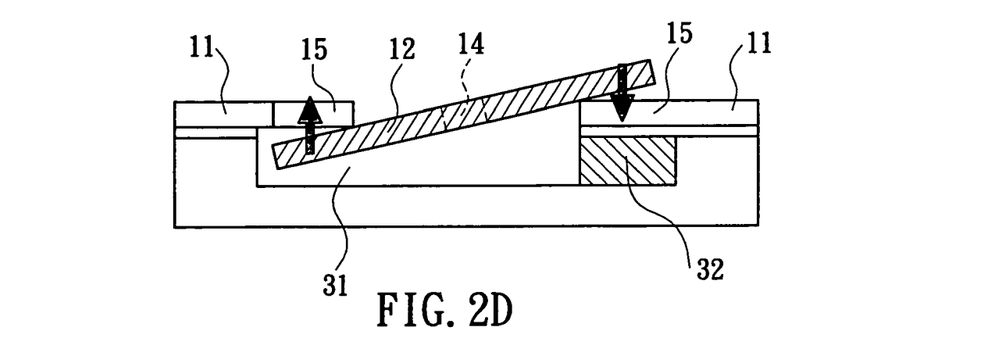

FIGS. 2A-2D and FIG. 3 show the operation of the MEMS actuator as described in FIG. 1. The movable element 12 is connected to electrical ground GND, the top stationary comb electrodes 15 and the bottom stationary comb electrodes 32 are connected to the first and the second AC voltage sources AC1, AC2, respectively as shown in FIG. 2A. Top stationary and movable elements 11, 12 form an in-plane comb actuator whereas bottom stationary element 32 and top movable element 12 form a vertical comb actuator. The movable element 12 starts oscillation with respect to the torsional hinges 14 through either the unbalance of electrostatic force in the in-plane comb actuator or the electrostatic attraction from the vertical actuator, FIG. 2A. The unbalance force in the in-plane comb may be introduced from manufacturing tolerances or intentional design features. Electrostatic attraction force from the vertical comb actuator will rotate the movable element 12 with respect to the torsional hinges 14 to the maximum deflection angle, FIGS. 2A~2B. After the movable element 12 reaches the largest deflection angle, electrostatic attraction force from the in-plane comb actuator will be applied to the movable element 12 until horizontal position is restored, FIGS. 2B~2C. The movable element 12 continues to rotate without actuation force to another maximum deflection angle, FIG. 2C~2D. After the movable element 12 reaches another maximum deflection angle, electrostatic attraction force from the in-plane comb actuator will again be applied to the movable element 12 until horizontal position is restored to complete one oscillation cycle, FIG. 2D~2A.

Figure 4:
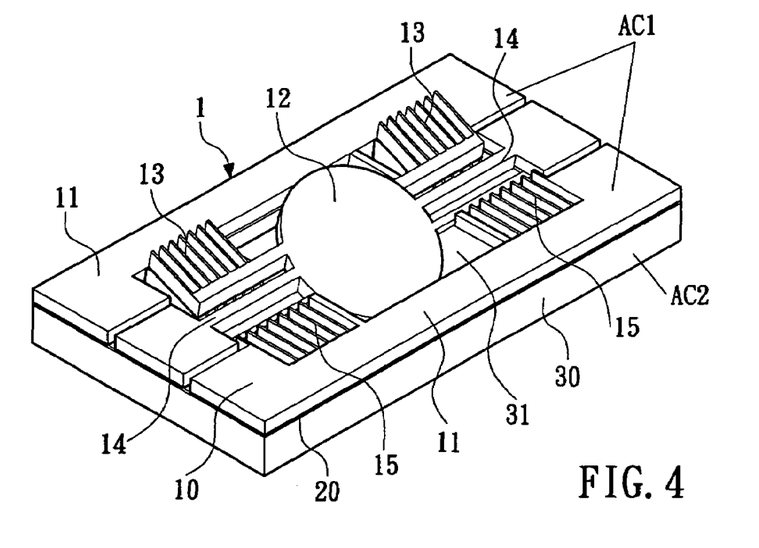
FIG. 4 illustrates the three dimensional view of the present invention where the mobile element is supported by a pair of torsional hinges and actuated by both in-plane and vertical comb structure.

FIG. 3 illustrates the relationship of the applied voltage sources and the operation of the MEMS actuator corresponding to FIG. 2. The movable element 12 is typically designed to oscillate at or near its resonance frequency of primary oscillation mode. The movable element 12 including top movable comb electrodes 13 is connected electrical ground GND. The first voltage source AC1 is applied to the top stationary structure (10) with in-plane comb electrodes 15. The second voltage source AC2 is applied to the bottom stationary comb electrodes 32 (30). The frequency of voltage source AC1 is typically twice the oscillation frequency of the movable element 12. The frequency of voltage source AC2 is the same as the oscillation frequency of the movable element 12. The waveform of AC1 and AC2 can be various shapes to achieve desired angular velocity of the movable element. Typically, waveform of square shape gives the highest efficiency in driving the movable element 12 to the largest rotation angle under given amplitude of AC1 and AC2. FIG. 4 shows a three-dimensional view of the MEMS actuator 1 with movable element 12 rotating to its largest angle.

The present invention combines both in-plane and vertical comb actuators to drive the movable element 12 to oscillate at large angle and at high frequency. Furthermore, the cavity 31 depth in the bottom layer 30 of the actuator, described in fabrication flow of FIGS. 1D, 1E and 1F, can be designed to be a mechanical stop to prevent excess deflection of the movable structure that could induce mechanical failure of the actuator.

Figure 5A:
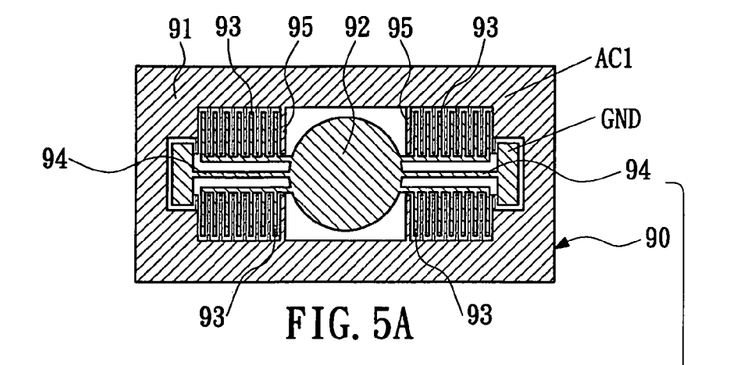
FIGS. 5A, 5B, and 5C show the top views of the top, middle and bottom layers of another embodiment of present invention where vertical comb electrodes on the bottom layer are electrically isolated into two halves of the different sides of the torsional hinges. Three voltage sources can be applied to achieve large actuation force on the mobile element.
Figure 5B:
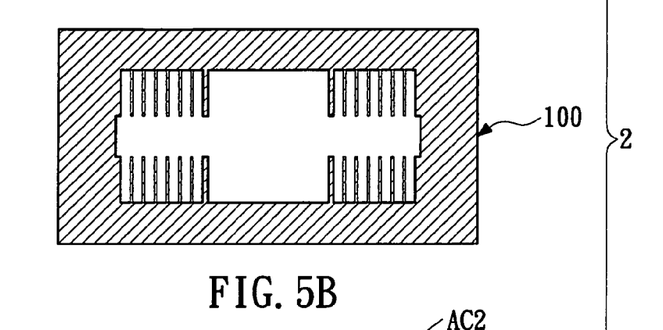
Figure 5C:
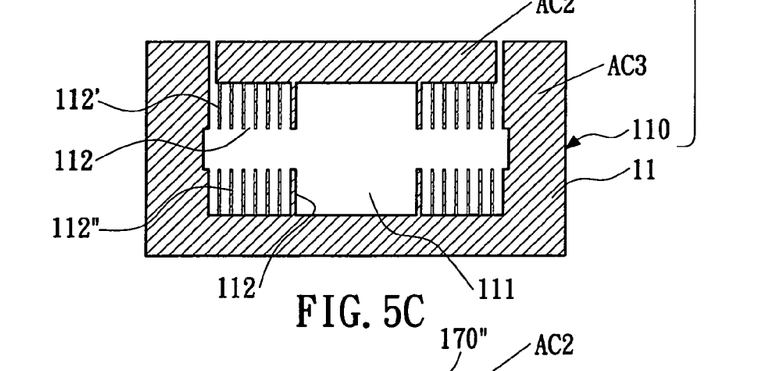

FIGS. 5A, 5B and 5C show the exploded top views of the three layers of a MEMS actuator 2 in accordance with another embodiment of the present invention. Top layer 90, FIG. 5A, is consisted of a stationary and a movable elements 91, 92, both made of electrically conductive material, typically doped single crystal silicon. Movable element 92 including comb electrodes 93 is supported by multiple torsional hinges 94 and is electrically isolated from stationary structure (91). The stationary element 91 has comb electrodes 95 that are interdigitated in the same horizontal plane with the comb electrodes 93 of the movable element 92 such that the top layer 90 is an in-plane comb-drive actuator. Middle layer 100, FIG. 5B, is made of electrically non-conductive material, typically silicon dioxide. Bottom layer 110, FIG. 5C, consisting of a cavity 111 and stationary comb electrodes 112, is made of electrically conductive material, typically doped single crystal silicon. Comb electrodes 112 on the bottom layer 110 are electrically isolated into two halves 112' 112" located on different sides of the torsional hinges 94. Stationary comb electrodes 112 on bottom layer 110 are interdigitated with comb electrodes 93 of the movable element 92 on top layer 90 such that the movable element 92 and the bottom layer 110 form a vertical comb-drive actuator with dual-side driving capability. Middle and bottom layers 100, 110 support the top layer 90 while middle layer 100 electrically isolates top and bottom layers 90, 110. As a result, the MEMS actuator 2 is consisted of both in-plane and vertical comb-drive actuators.

FIGS. 6A-6D illustrate one method of fabricating the comb-drive actuator in accordance with the embodiment as described in FIGS. 5A-5C. The first step, FIG. 6A, starts by etching the backside 121 of a semiconductor wafer 120, preferably single crystal silicon then etches the front-side 122 using deep reactive ion etching (DRIE) with the etched features (124) on backside 121 for alignment (123, 124). Cavity 125 size and depth, and the stationary vertical comb electrodes 126 are defined. The next step is to fusion bond the double-side 121, 122 etched wafer 120 to another wafer 130 coated with silicon dioxide 140 then annealed to increase bonding strength, FIG. 6B. The bonded wafer 150 becomes a three layer structure and the top layer 130 may be ground and polished to desired thickness and to the required surface quality. Backside (121) of the bonded wafer 150 is separated into two halves using 150', 150" DRIE, FIG. 6C. Since the bottom layer 120 is bonded to the top layer 130 so the three layer structure remains intact. The top layer 130 is then DRIE etched down to the middle layer 140 using the backside (121) features (124) for alignment (131, 124) and the movable element 132 of the three-layer structure is released by removing the silicon dioxide (140) connecting to the stationary elements 126, FIG. 6D.

The comb-drive actuator 2, described in FIGS. 5A, 5B and 5C, can also be fabricated using process flow steps of FIGS. 1G and 1H. The process starts with back-side DRIE etching of the bottom layer 161 to the middle oxide layer 162 of a SOI wafer 160 and also separates the bottom layer into two halves, FIG. 1G. Since the bottom layer is bonded to the top layer so the three layer structure remains intact. The wafer 160 is then etched from the front-side 163 of the wafer 160 to the middle oxide layer 162, FIG. 1H. The movable element of the three-layer structure is then released by removing the silicon dioxide connecting to the stationary elements 164.

Figure 5D:
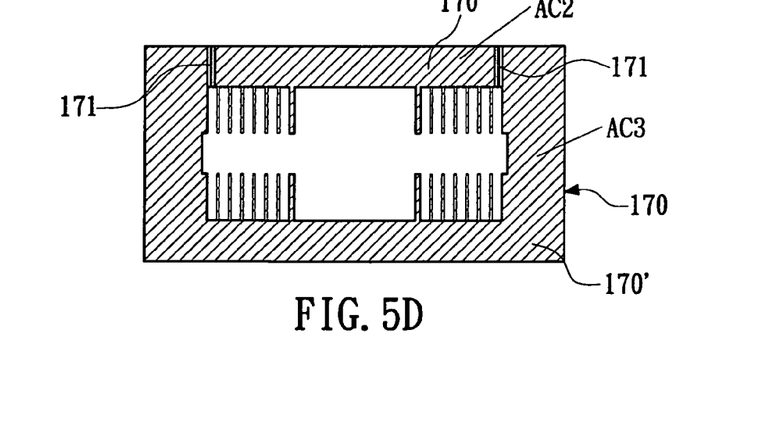
FIG. 5D illustrates another design of the bottom layer of the embodiment as depicted in FIG. 5C. The two sets of electrically isolated vertical comb electrodes are reinforced through thin film deposition processes.
Figure 6A:
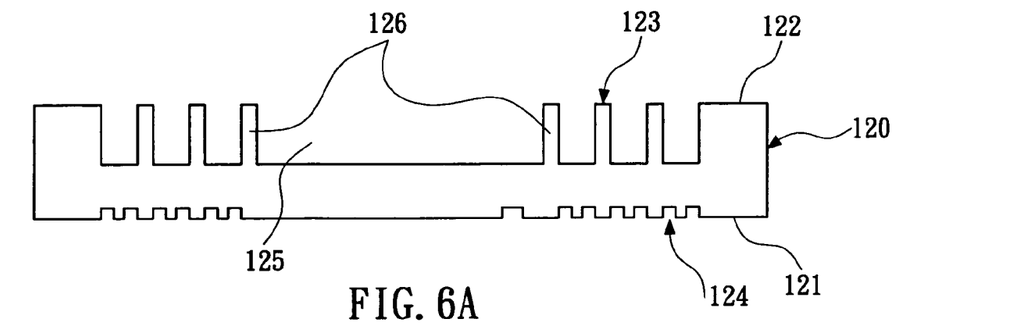
FIGS. 6A~6D illustrate one fabrication process flow steps of the embodiment as described in FIGS. 5A, 5B and 5C.
Figure 6B:
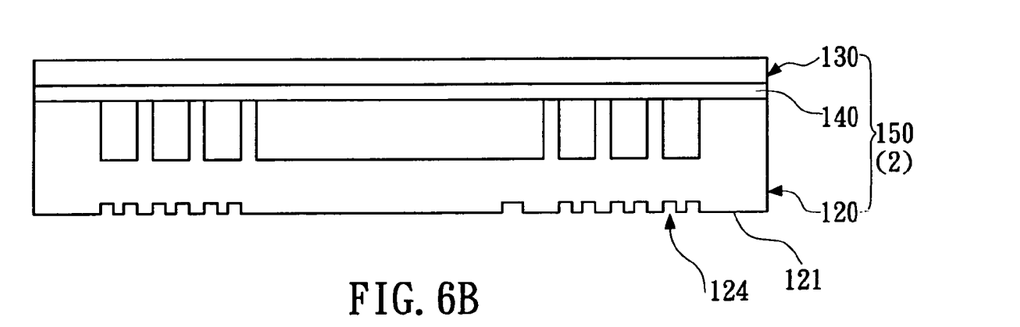
Figure 6C:
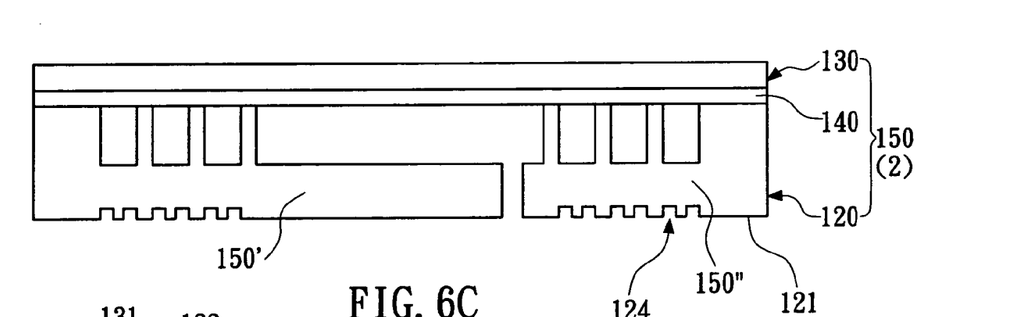
Figure 6D:
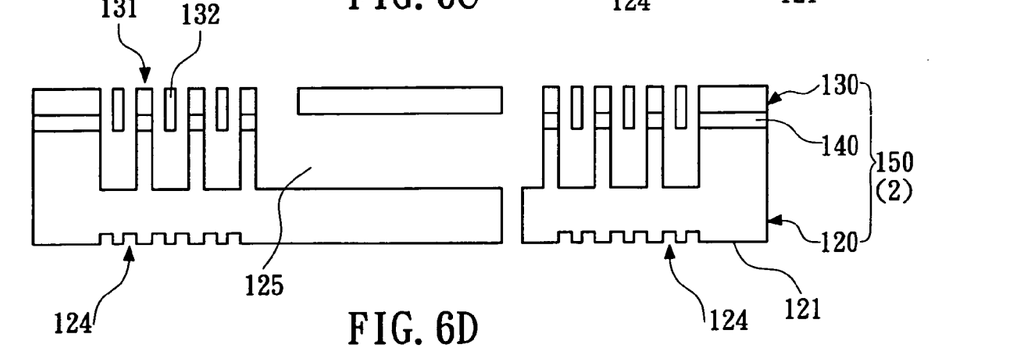
Figure 7A:
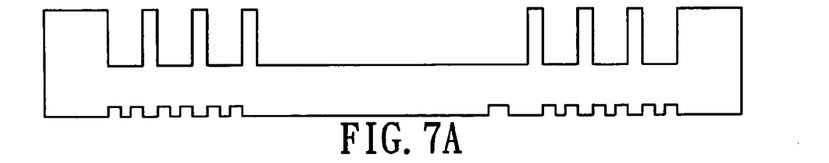
FIGS. 7A~7F illustrate the fabrication process flow steps of the embodiment as described in FIGS. 5A, 5B and 5D.
Figure 7B:
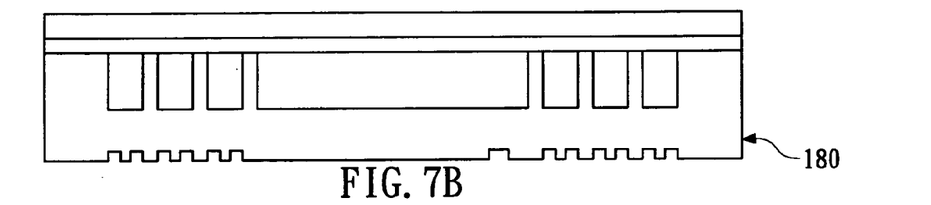
Figure 7C:
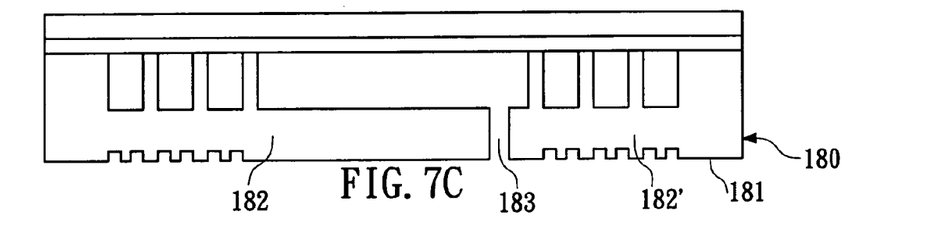
Figure 7D:
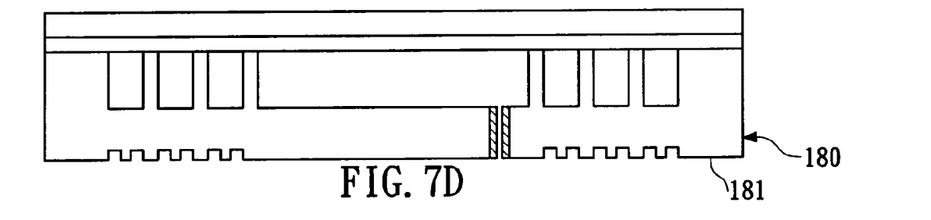
Figure 7E:
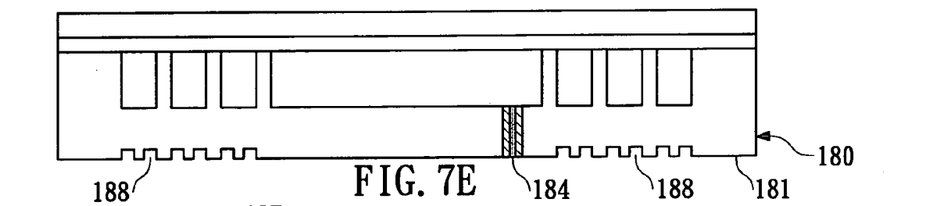
Figure 7F:
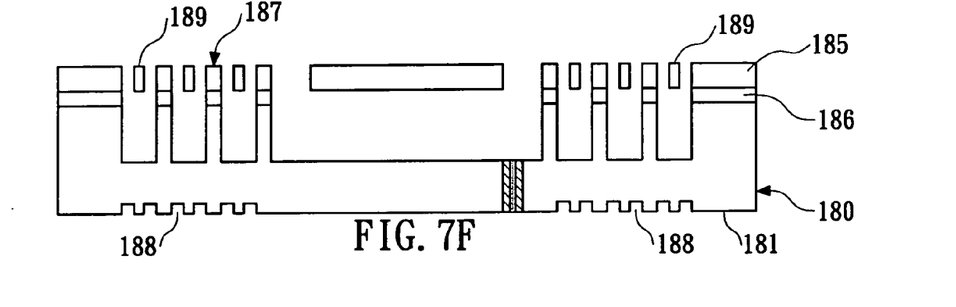
Figure 8A:
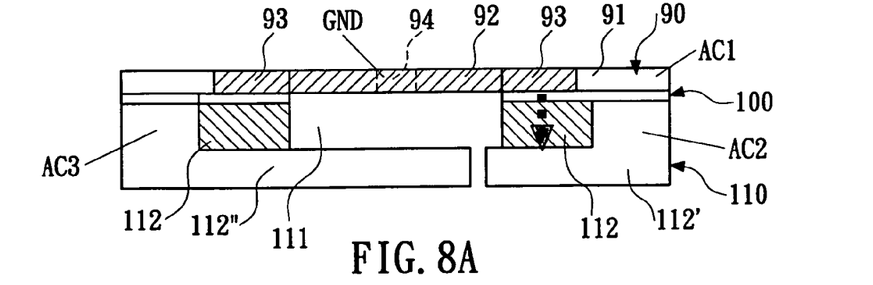
FIGS. 8A~8D illustrate the side view of the embodiment as described in FIG. 5 and show the relationship of actuation force of in-plane and vertical comb electrodes when the mobile structure of top layer is in oscillation motion. The vertical comb electrodes on the bottom layer are electrically isolated on each side of the torsional hinges.
Figure 8B:
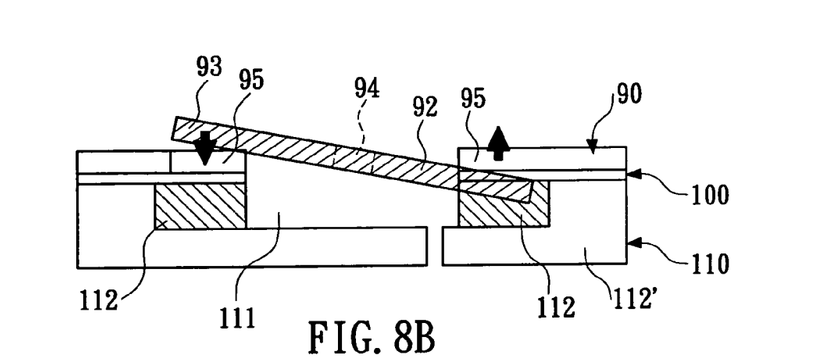
Figure 8C:
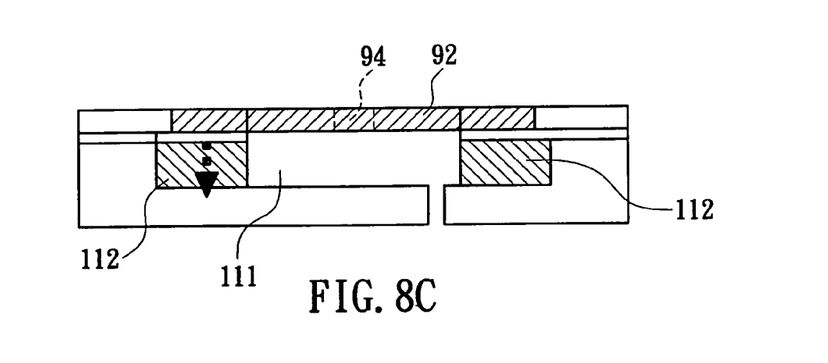
Figure 8D:
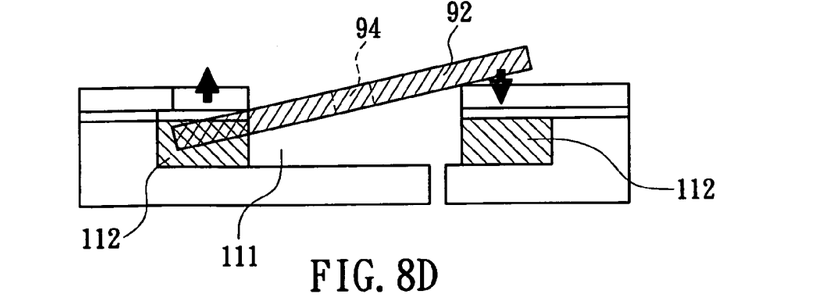

FIG. 5D shows a variation of the bottom layer 110 as described in FIG. 5C. The bottom layer 170 are electrically isolated into two halves 170', 170" and reinforced with thin film deposited materials 171. The reinforcement materials (171) must have electrically non-conductive materials such as silicon dioxide. The comb-drive actuator, defined by FIGS. 5A, 5B and 5D, can be fabricated with process steps of FIGS. 7A~7F. Process steps of FIGS. 7A~7C is the same as process steps of FIGS. 6A~6C. After the backside 181 of wafer 180 is etched and separated into two halves 182, 182', FIG. 7C, electrically isolated material such as silicon dioxide is deposited on the backside 181 and the opened channels 183 using thin film processes, FIG. 7D. Another layer of material 184, such as polysilicon, is further deposited on the backside 181 and the opened channels 183 to complete the reinforcement, FIG. 7E. The thin film materials on the backside 181 may be removed by grinding and polishing. Top layer 185 is then DRIE etched down to the middle layer 186 using the backside 181 features (188) for alignment (187, 188) and the movable element 189 of the three-layer structure is released by removing the silicon dioxide connecting to the stationary elements, FIG. 7F.

Figure 9:
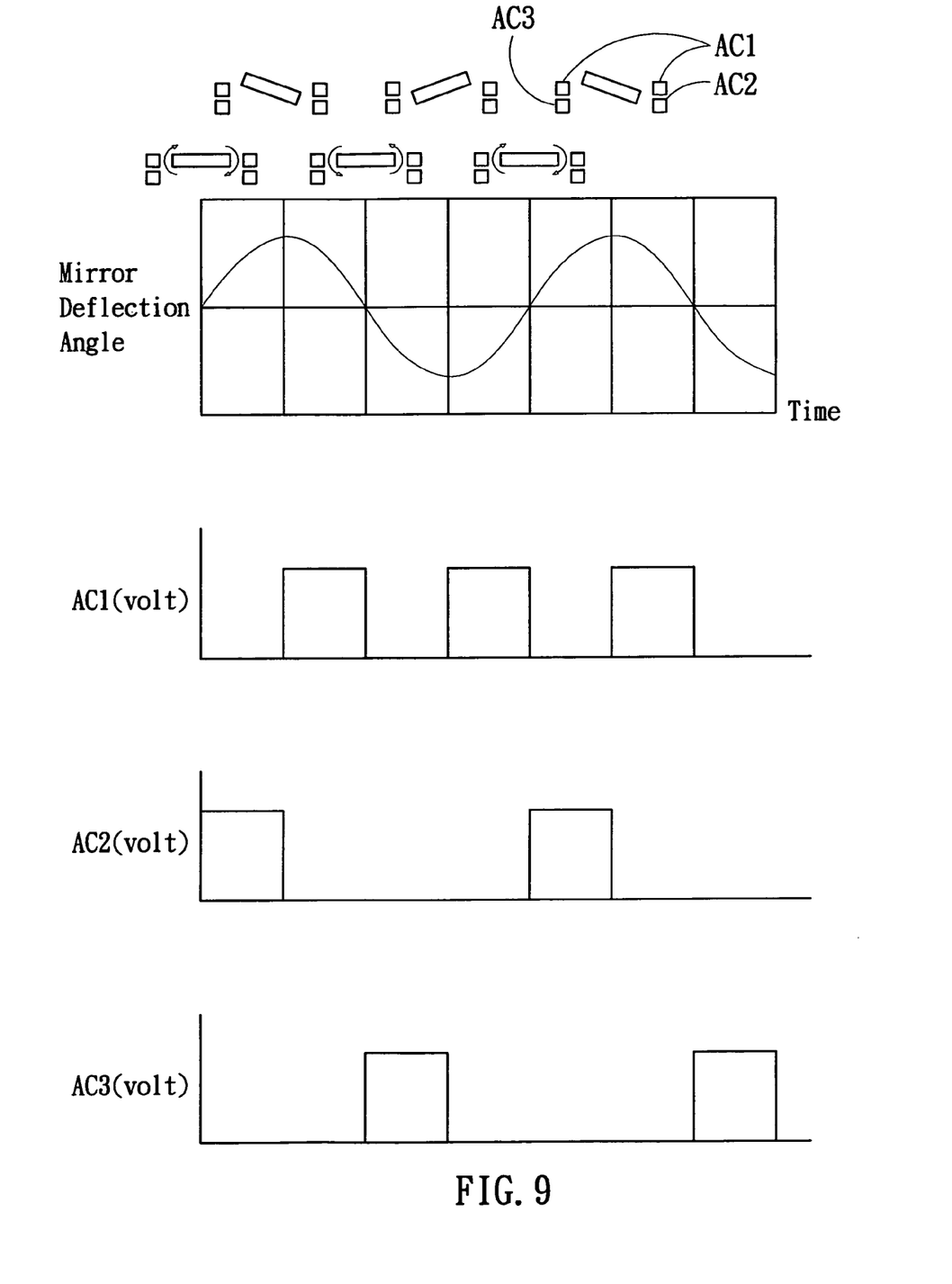
FIG. 9 illustrates one example of the relationship between the phase of mirror deflection angle and the phase of applied voltage sources for MEMS actuator depicted in FIG. 8.

FIG. 8 and FIG. 9 illustrate the operation of the MEMS actuator as described in FIG. 5. Movable element 92 on top layer 90 is connected to electrical ground GND while stationary comb electrodes 95 is connected the first AC voltage source AC1. The two sets of bottom (110) stationary comb electrodes 112 are connected to the second (AC2) and the third (AC3) AC voltage sources AC2, AC3, respectively as shown in FIG. 8A. Movable element 92 starts oscillation with respect to the torsional hinges 94 through either the unbalance of electrostatic force in the in-plane comb electrodes 93, 95 or the electrostatic attraction from the vertical comb electrodes 112, FIG. 8A. The unbalance force in the in-plane comb may be introduced from manufacturing tolerances or intentional design features. Electrostatic attraction force from one side of the vertical comb actuator will rotate the movable element 92 with respect to the torsional hinges 94 to the maximum deflection angle, FIGS. 8A~8B. After the movable element 92 reaches the largest deflection angle, electrostatic attraction force from the in-plane comb actuator will be applied to the movable element 92 until horizontal position is restored, FIGS. 8B~8C. Electrostatic attraction force from another side of the vertical comb electrodes will rotate the movable element 92 to another maximum deflection angle, FIGS. 8C~8D. After the movable element reaches another maximum deflection angle, electrostatic attraction force from the in-plane comb actuator will again be applied to the movable element until horizontal position is restored to complete one oscillation cycle, FIGS. 8D~8A.

FIG. 9 illustrates the relationship of the applied voltage sources and the operation of the MEMS actuator 2 corresponding to FIG. 5. The movable element 92 is typically designed to oscillate at or near its resonance frequency of primary oscillation mode. The movable element 92 including top movable comb electrodes 93 is connected electrical ground GND. First voltage source AC1 is applied to the top stationary structure (90) with in-plane comb electrodes 95. Second voltage source AC2 is applied to one set of the bottom stationary comb electrodes (112'). Third voltage source AC3 is applied to another set of the bottom stationary comb electrodes 112(112"). The frequency of voltage source AC1 is typically twice the oscillation frequency of the movable element 92. The frequency of voltage sources AC2 and AC3 are the same as the oscillation frequency of the movable element 92 but at different phases. The waveform of AC1, AC2 and AC3 can be various shapes to achieve desired angular velocity of the movable element. Typically, waveform of square shape gives the highest efficiency in driving the movable element to the largest rotation angle under given amplitude of AC1, AC2 and AC3.

Figure 10A:
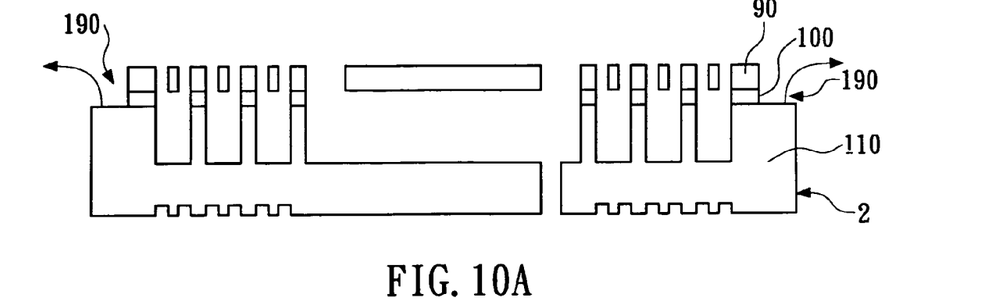
FIGS. 10A, 10B, and 10C illustrate the methods to connect the two set of electrically isolated vertical comb electrodes located on the bottom layer of the actuator as described in FIG. 1 and FIG. 5.

FIG. 10A illustrates a method to form electrical connections to the bottom layer 110 of the actuator 2 with SOI structure. Additional openings 190 on the top layer 90 are etched in DRIE etching process step as described in FIGS. 1F, 1H, 6D or 7F to expose access to the middle layer 100. Electrical insulation material of the middle layer 100 in the exposed area is then removed during structure release process. Connections can be made to the bottom layer 110 through conventional methods such as wire-bonding after deposition of metallic contact pad.

Figure 10B:
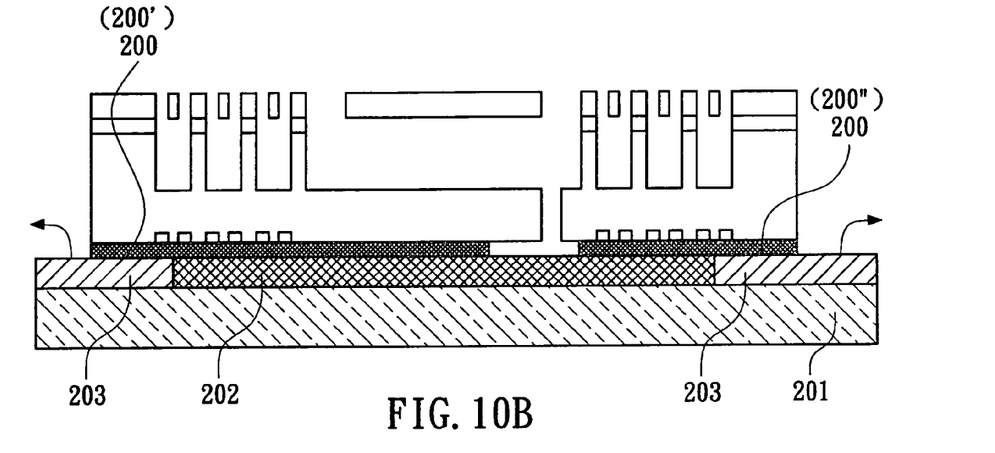
Figure 10C:
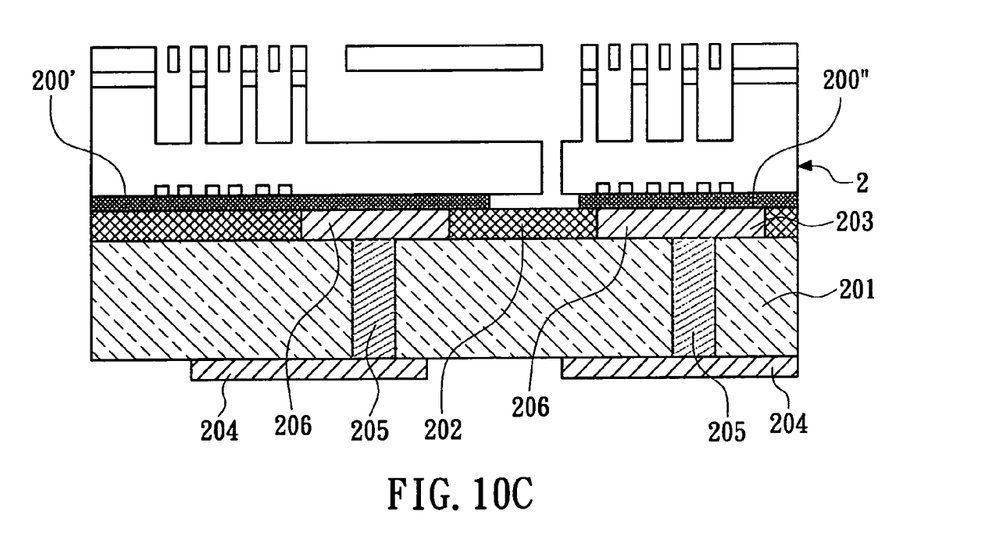

FIGS. 10B and 10C illustrate another method to form electrical connections to the bottom layer 110 of the actuator 2 with SOI structure. The SOI structure is connected to a substrate 201 through a layer of electrically conductive material 200 which is separated into two halves 200', 200" to avoiding electrical bridging. The conductive material 200 may be conductive paste, conductive film, solder paste, etc. The substrate 201 is configured for fan-out of the bottom comb electrodes. Dielectric material 202 is disposed on the substrate 201 which insulates the metal conductor pads 203 on the substrate 201. Fan-out can be done from the top side conductor pads 203 of the substrate 201, FIG. 10B or from bottom side conductor pads 204 connecting to top side conductor pads 203 through via holes 205, FIG. 10C.

Figure 11:
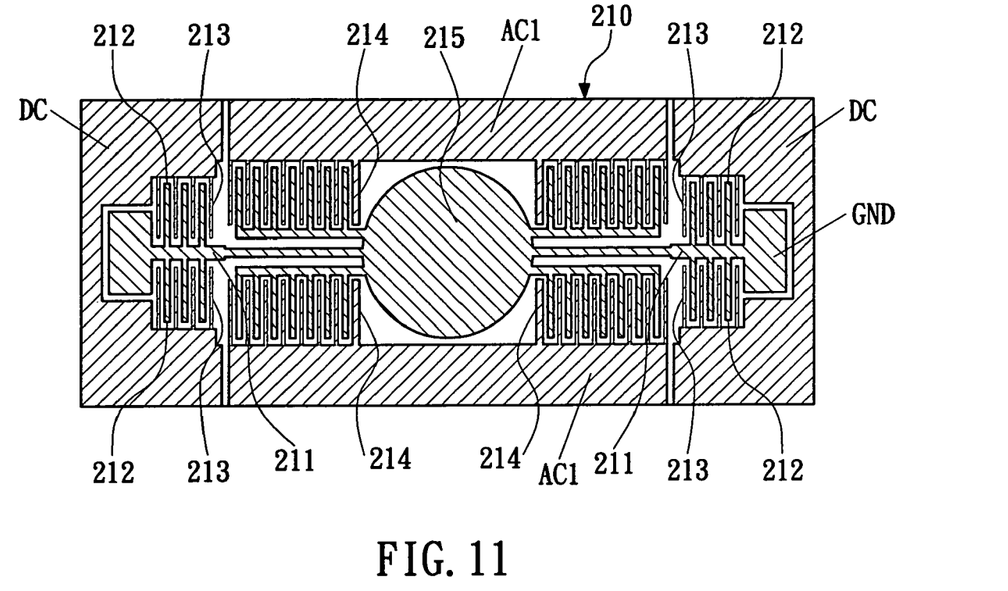
FIG. 11 illustrates another embodiment of the invention that additional in-plane comb electrodes are added to the torsional hinges and to the stationary structure on the top layer of the actuator. A voltage difference between the additional comb electrodes sets may be applied to increase the effective stiffness of the hinges.

FIG. 11 illustrates one invention embodiment to adjust the structural resonance frequency of the movable element by increasing the effective torsional stiffness of the torsional hinges. Torsional hinges 211 are designed with comb electrodes 212 and are interdigitated with a set of comb electrodes 213 on the stationary structure of the top layer 210. This set of comb electrodes 213 on the top stationary structure are connected to a DC voltage source and are electrically isolated from the rest of the comb electrodes 214 on the top layer 210. During oscillation motion of the movable element 215, the voltage difference between the DC voltage and the ground GND will generate electrostatic attraction force between the additional comb electrodes 212, 213 which will suppress the torsional rotation of the portion of hinge 211 with additional electrodes 212. By adjusting the voltage difference between DC and ground, the effective torsional stiffness of the hinges 211 can be increased such that resonance frequency of the movable element can be tuned.

Figure 12:
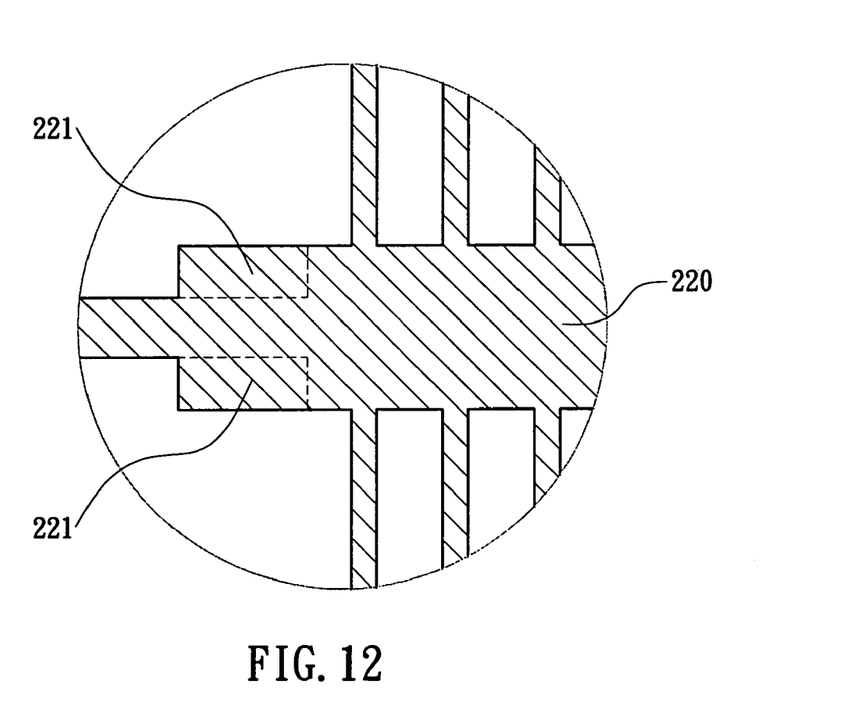
FIG. 12 illustrates the torsional hinge with protrusion areas that may be removed by laser or other means to reduce the torsional stiffness of the hinge.

FIG. 12 illustrates another invention embodiment to adjust the structural resonance frequency of the movable element by thinning portions or trimming portions of protrusions 221 on the torsional hinges 220. The protrusions 221 may be removed selectively utilizing techniques such as laser trimming, E-beam lithography, etc without damaging structural integrity. The effective torsional stiffness of the torsional hinges are reduced such that the resonance frequency of the movable element can be tuned.

What is claimed is:

1. A micro-electro-mechanical comb-drive actuator (1), comprising:
    a first semiconductor layer (10) having:
        a movable element (12) supported by multiple hinges (14) to allow pivoting about an rotation axis and having a first and a second sets of comb electrodes (13) located on opposite sides of the axis;
        a stationary element (11) having a third and a fourth sets of comb electrodes (15);
        wherein the teeth of the first and the second sets of comb electrodes (13) are interdigitated in the same plane with the teeth of the third and the fourth sets of comb electrodes (15);
    an electrical insulation layer (20) which supports and insulates the semiconductor layers; and
    a second semiconductor layer (30) consisting a cavity (31);
    wherein the first and the second sets of comb electrodes (13) are coupled to a first voltage (GND), and the third and the fourth sets of comb electrodes (15) are coupled to a second voltage (AC1), and
    wherein a first oscillating voltage difference between the first and the second voltages at around twice the resonant frequency of the application oscillates the movable element (13) about the rotation axis.

2. A micro-electro-mechanical comb-drive actuator (1) according to claim 1, wherein the second semiconductor layer (30) having a fifth set of stationary comb electrodes (32) located on one side of the rotation axis of the movable element and the teeth of the fifth set of comb electrodes (32) are interdigitated vertically with the first set of comb electrodes (13) of the movable element, and wherein the fifth set of comb electrodes (32) is coupled to a third voltage (AC2) and a second oscillating voltage difference between the first and the third voltages at around the resonant frequency of the application oscillates the movable element (12) about the rotation axis.

3. A micro-electro-mechanical comb-drive actuator (1) according to claim 2, the first voltage is ground (GND), the second voltage is a first AC voltage source (AC1), and the third voltage is a second AC voltage source (AC2).

4. A micro-electro-mechanical comb-drive actuator (1) according to claim 1, wherein the first semiconductor layer (210) has a sixth set of comb electrodes (213) located on the stationary structure and electrically isolated from the movable and the stationary electrodes (212, 214), and the torsional hinges (211) have a seventh set of comb electrodes (212) that are interdigitated in the same plane with the sixth set of comb electrodes (213).

5. A micro-electro-mechanical comb-drive actuator according to claim 4, wherein the sixth set of comb electrodes (213) is connected to a DC voltage source to tune the resonance frequency of the movable element (215).

6. A micro-electro-mechanical comb-drive actuator according to claim 1, wherein the hinges (220) contain protrusions (221) with the same thickness of the first semiconductor layer (210) and perpendicular to the rotation axis that are removed or thinned to tune the resonance frequency of the movable element (215).

7. A micro-electro-mechanical comb-drive actuator (2), comprising:
a first semiconductor layer (90) having:
a movable element (92) supported by multiple hinges (94) to allow pivoting about an axis and having a first and a second sets of comb electrodes (93) located on opposite sides of the axis; and
a stationary element (91) having a third and a fourth sets of comb electrodes (95);
wherein the teeth of the first and the second comb electrodes (93) are interdigitated in the same plane with the teeth of the third and the fourth comb electrodes (95);
an electrical insulation layer (100) which supports and insulates the semiconductor layers (90, 110); and
a second semiconductor layer (110) having:
a cavity (111); and
a fifth and a sixth sets of stationary comb electrodes (112', 112") electrically isolated and located on opposite sides of the rotation axis of the movable element (92);
wherein the teeth of the fifth and the sixth sets of comb electrodes (112', 112") are interdigitated vertically with the first and the second sets of comb electrodes (93) of the movable element (92);
wherein the first and the second sets of comb electrodes (93) are coupled to a first voltage (GND), the third and the fourth sets of comb electrodes (95) are coupled to a second voltage (AC1), the fifth set of comb electrodes (112') is coupled to a third voltage (AC2), and the sixth set of comb electrodes (112") is coupled to a fourth voltage (AC3), and
wherein a first oscillating voltage difference between the first and the second voltages (GND, AC1) at around twice the resonant frequency of the application, and a second oscillating voltage difference between the first and the third voltages (GND, AC2) and a third oscillating voltage difference between the first and the fourth voltages (GND, AC3) at around the resonant frequency of the application oscillate the movable element (92) about the rotation axis.

8. A micro-electro-mechanical comb-drive actuator (2) according to claim 7, the first voltage (GND) is ground, the second voltage (AC1) is a first AC voltage source, the third voltage (AC2) is a second AC voltage source and the fourth voltage (AC3) is a third AC voltage source.

9. A micro-electro-mechanical comb-drive actuator (2) according to claim 7, wherein the first semiconductor layer (210) has a seventh set of comb electrodes (213) located on the stationary structure and electrically isolated from the movable and the stationary electrodes (212, 214), and the torsional hinges (211) have an eighth set of comb electrodes (212) that are interdigitated in the same plane with the seventh set of comb electrodes (213).

10. A micro-electro-mechanical comb-drive actuator according to claim 9, wherein the seventh set of comb electrodes (213) is connected to a DC voltage source (DC) to tune the resonance frequency of the movable element (215).

11. A micro-electro-mechanical comb-drive actuator (2) according to claim 7, wherein the hinges (211) contain protrusions (221) with the same thickness of the first semiconductor layer (210) and perpendicular to the rotation axis that are removed or thinned to tune the resonance frequency of the movable element (215).

12. The micro-electro-mechanical comb-drive actuator (2) of claim 7, further comprising a substrate (201) having:
a layer of adhesive material (200) that is electrically conductive and divided into two insulated halves (200', 200"); and
a first and a second conductors (203) electrically isolated and located on a surface thereof and being at least partially exposed;
wherein the two insulated halves (200', 200") of the adhesive material (200) are electrically coupled to the first and the second conductors (203), and
wherein the fifth set of comb electrodes (112') is coupled to the first conductor and the sixth set of comb electrodes (112") is coupled to the second conductor.

13. The micro-electromechanical comb-drive actuator (2) according to claim 12, wherein the substrate (201) includes a third and a fourth conductors (204) electrically isolated and located on opposite surface of the first and the second conductors (206), and via holes (205) connecting the first conductor to the third conductor and connecting the second conductor to the fourth conductor.

* * * * *